US011946161B2

(12) United States Patent
Wang et al.

(10) Patent No.: US 11,946,161 B2
(45) Date of Patent: Apr. 2, 2024

(54) METHOD FOR SYNTHESIZING INTERGROWN TWIN Ni₂Mo₆S₆O₂/MoS₂ TWO-DIMENSIONAL NANOSHEET

(71) Applicant: Institute of Analysis, Guangdong Academy of Sciences (China National Analytical Center, Guangzhou), Guangzhou (CN)

(72) Inventors: Fuxian Wang, Guangzhou (CN); Hui Cheng, Guangzhou (CN); Liling Wei, Guangzhou (CN); Qiong Liu, Guangzhou (CN)

(73) Assignee: Institute of Analysis, Guangdong Academy of Sciences (China National Analytical Center, Guangzhou), Guangzhou (CN)

( * ) Notice: Subject to any disclaimer, the term of this patent is extended or adjusted under 35 U.S.C. 154(b) by 359 days.

(21) Appl. No.: 17/624,258

(22) PCT Filed: Jan. 13, 2021

(86) PCT No.: PCT/CN2021/071351
§ 371 (c)(1),
(2) Date: Dec. 31, 2021

(87) PCT Pub. No.: WO2021/238235
PCT Pub. Date: Dec. 2, 2021

(65) Prior Publication Data
US 2023/0227999 A1 Jul. 20, 2023

(30) Foreign Application Priority Data

Jan. 8, 2021 (CN) .......................... 202110020771.7

(51) Int. Cl.
*C30B 29/46* (2006.01)
*B82Y 40/00* (2011.01)
(Continued)

(52) U.S. Cl.
CPC .............. *C30B 29/46* (2013.01); *B82Y 40/00* (2013.01); *C25B 1/04* (2013.01); *C25B 11/091* (2021.01); *C30B 7/14* (2013.01); *C30B 29/64* (2013.01)

(58) Field of Classification Search
None
See application file for complete search history.

(56) References Cited

FOREIGN PATENT DOCUMENTS

| CN | 106145190 A | 11/2016 |
|---|---|---|
| CN | 107968208 A | 4/2018 |

(Continued)

OTHER PUBLICATIONS

Ying Cao, et al., Highly efficient oxidative desulfurization of dibenzothiophene using Ni modified MoO3 catalyst, Applied Catalysis A, General, 2019.

(Continued)

*Primary Examiner* — Brian W Cohen
(74) *Attorney, Agent, or Firm* — Bayramoglu Law Offices LLC

(57) ABSTRACT

A method for synthesizing an intergrown twin Ni₂Mo₆S₆O₂/MoS₂ two-dimensional nanosheet with exposed (00L) crystal planes is disclosed. An Ni—Mo bonded precursor is formed by using an ion insertion method to restrict Ni ions to be located in a lattice matrix of a Mo-based compound; a dinuclear metal sulfide Ni₂Mo₆S₆O₂ is formed by precisely adjusting and controlling a concentration of a sulfur atmosphere and utilizing a reconstruction effect of Ni element in the lattice matrix of the Mo-based compound; and meanwhile, a growth direction of Ni₂Mo₆S₆O₂ is precisely adjusted and controlled by using a method for growing a single crystal in a limited area, so that Ni₂Mo₆S₆O₂ is grown, taking a single crystal MoS₂ as a growth template, with the single crystal MoS₂ alternately along a crystal plane (Continued)

(110) of the single crystal $MoS_2$, so as to form a twin $Ni_2Mo_6S_6O_2/MoS_2$ two-dimensional nanosheet in which $Ni_2Mo_6S_6O_2$ and $MoS_2$ are intergrown.

14 Claims, 5 Drawing Sheets

(51) Int. Cl.
*C25B 1/04* (2021.01)
*C25B 11/091* (2021.01)
*C30B 7/14* (2006.01)
*C30B 29/64* (2006.01)

(56) References Cited

FOREIGN PATENT DOCUMENTS

| | | |
|---|---|---|
| CN | 108686710 A | 10/2018 |
| CN | 109174130 A | 1/2019 |
| CN | 110479295 A | 11/2019 |
| CN | 110876946 A | 3/2020 |
| CN | 111437840 A | 7/2020 |
| CN | 111589453 A | 8/2020 |
| CN | 112144028 A | 12/2020 |
| WO | 2019135827 A1 | 7/2019 |

OTHER PUBLICATIONS

Xuewei Hou, et al., Cobalt-molybdenum disulfide supported on nitrogen-doped graphene towards an efficient hydrogen evolution reaction, International Journal of Hydrogen Energy, 2019, pp. 11664-11674, vol. 44.

METHOD FOR SYNTHESIZING INTERGROWN TWIN $Ni_2Mo_6S_6O_2/MoS_2$ TWO-DIMENSIONAL NANOSHEET

CROSS REFERENCE TO THE RELATED APPLICATIONS

This application is the national phase entry of International Application No. PCT/CN2021/071351, filed on Jan. 13, 2021, which is based upon and claims priority to Chinese Patent Application No. 202110020771.7, filed on Jan. 8, 2021, the entire contents of which are incorporated herein by reference.

TECHNICAL FIELD

The present invention relates to the field of catalysis, and in particular to a method for synthesizing an intergrown twin $Ni_2Mo_6S_6O_2/MoS_2$ two-dimensional nanosheet with exposed (00L) crystal planes.

BACKGROUND

Under the background of a new generation of energy, especially the fact that hydrogen energy vehicles are gradually replacing gasoline vehicles, the demand for hydrogen energy and high-yield hydrogen quality (that is, hydrogen purity) is increasing day by day. Therefore, the hydrogen production technology of the hydrogen production industry as an upstream industry plays a vital role in the development of the hydrogen energy industry. The technology for producing hydrogen by electrolyzing water, as a new type of technology for producing hydrogen, has been found to have unique advantages in the new generation of hydrogen energy industry. Nevertheless, the traditional commercial Pt/C catalysts have greatly hindered the popularization and industrial application of the process for electrolyzing water due to their high cost. In view of this, to find a cheap and efficient cathodic catalyst for electrolyzing water is vital to further improve the efficiency for electrolyzing water and reduce the cost for electrolyzing water. Among many alternative inexpensive catalysts, molybdenum sulfide has attracted attention due to its outstanding Hydrogen Evolution Reaction (HER) performance. However, the HER performance of molybdenum sulfide, especially the performance of molybdenum sulfide under a high current condition, still has not reached an expected value. Specifically, this is because the molybdenum sulfide of the mononuclear active site mode (i.e., the Mo active site) cannot simultaneously satisfy the effective adsorption for two intermediate products $H^+$ and $OH^-$, which ultimately leads to the need to overcome a large energy barrier in the reaction process, resulting in a slow decomposition rate of $H_2O$. Therefore, the introduction of a second active site with the best $OH^-$ adsorption capacity into the catalytic material can well reduce the energy barrier during the decomposition of $H_2O$, thereby promoting the catalytic reaction for electrolyzing water.

SUMMARY

An object of the present invention is to provide a method for synthesizing an intergrown twin $Ni_2Mo_6S_6O_2/MoS_2$ two-dimensional nanosheet with exposed (00L) crystal planes, wherein an Ni—Mo bonded precursor is formed by using an ion insertion method to restrict Ni ions to be located in a lattice matrix of a Mo-based compound; a dinuclear metal sulfide $Ni_2Mo_6S_6O_2$ is formed by precisely adjusting and controlling a concentration of a sulfur atmosphere; and meanwhile, a growth direction of $Ni_2Mo_6S_6O_2$ is precisely adjusted and controlled by using a method for growing a single crystal in a limited area, so that $Ni_2Mo_6S_6O_2$ is grown, taking a single crystal $MoS_2$ as a growth template, with the single crystal $MoS_2$ alternately along a crystal plane (110) of the single crystal $MoS_2$, so as to form a twin $Ni_2Mo_6S_6O_2/MoS_2$ two-dimensional nanosheet in which $Ni_2Mo_6S_6O_2$ and $MoS_2$ are intergrown.

The present invention is realized by the following technical solution:

a method for synthesizing an intergrown twin $Ni_2Mo_6S_6O_2/MoS_2$ two-dimensional nanosheet with exposed (00L) crystal planes, wherein an Ni—Mo bonded precursor is formed by using an ion insertion method to restrict Ni ions to be located in a lattice matrix of a Mo-based compound; a dinuclear metal sulfide $Ni_2Mo_6S_6O_2$ is formed by precisely adjusting and controlling a concentration of a sulfur atmosphere; and meanwhile, a growth direction of $Ni_2Mo_6S_6O_2$ is precisely adjusted and controlled by using a method for growing a single crystal in a limited area, so that $Ni_2Mo_6S_6O_2$ is grown, taking a single crystal $MoS_2$ as a growth template, with the single crystal $MoS_2$ alternately along a crystal plane (110) of the single crystal $MoS_2$, so as to form a twin $Ni_2Mo_6S_6O_2/MoS_2$ two-dimensional nanosheet in which $Ni_2Mo_6S_6O_2$ and $MoS_2$ are intergrown.

The method includes the steps of:

1) obtaining a solution A, by dissolving a molybdenum source and a nickel source in a $H_2O_2$ aqueous solution and heating at a constant temperature until the molybdenum source and the nickel source are completely dissolved; wherein a Mo:Ni molar ratio of the molybdenum source and the nickel source is 1:1-1:2, a mass percentage of the $H_2O_2$ aqueous solution is 1-10 wt. %, and the heating temperature is 60-90° C.;

2) obtaining a saturated solution B containing a large amount of undissolved soluble salt solids, by adding a soluble salt into pure water under heating and stirring and stopping the heating and stirring after crystallization occurs above the mixture and cooling the mixture in ice water; wherein the soluble salt includes sodium chloride, potassium chloride, sodium sulfate and potassium sulfate;

3) obtaining a mixture C, by mixing and stirring the solution A, the solution B, and all undissolved soluble salt solids of step 2); wherein the undissolved soluble salt solids can greatly strengthen the confinement effect, greatly restrict the growth of the product in a single direction, and make the product grow to finally become a single crystal two-dimensional nanosheet;

4) obtaining a dry solid, by placing the mixture C in liquid nitrogen for freezing and then placing the mixture C in a vacuum freeze dryer for vacuum freeze-drying for 12-48 hours, the obtained dry solid is placed in a porcelain boat A, and then the porcelain boat A is placed in the center of a tube furnace, and a porcelain boat B containing a sulfur source is placed at an uptake port of the porcelain boat A, and in order to obtain a target product, the distance between the porcelain boat A and the porcelain boat B must be precisely adjusted to be 3-4 cm, so that the concentration of the sulfur source above the porcelain boat A is moderate to prevent the excessive concentration of the sulfur source from destroying the Ni—Mo structure to form separate $NiS_2$ and $MoS_2$;

5) introducing inert gas into the tube furnace, adjusting and controlling a flow rate of the inert gas to be 10-25 ml/min, and raising the temperature to a target temperature for constant temperature calcination; wherein the temperature raising rate is 1-10° C./min, the target temperature is 300-500° C., and the constant temperature calcination time is 1-10 hours; and 6) taking out the porcelain boat A after the vulcanization is completed, washing the sample in the porcelain boat A with pure water and ethanol and then drying at room temperature, the resulting product is an intergrown twin $Ni_2Mo_6S_6O_2/MoS_2$ two-dimensional nanosheet.

The molybdenum source includes molybdenum powder, molybdenum trioxide, molybdenum dioxide, ammonium molybdate and molybdenum acetylacetonate, and the nickel source includes nickel nitrate, nickel acetylacetonate and nickel chloride.

In step 2), a mass of the soluble salt is 10-50 g, a volume of the pure water is 5-30 mL, and the heating temperature is 50-100° C.

In step 3), a volume of the pipetting solution A is 0.05-0.2 mL, and a volume of the pipetting solution B is 0.5-2 mL.

In step 4), the sulfur source includes thiourea and elemental sulfur, and a mass of the sulfur source is 10-40 g.

In step 5), the inert gas includes nitrogen and argon.

The present invention further protects an application of the intergrown twin two-dimensional nanosheet with exposed (00L) crystal planes obtained by the above method in the electrocatalytic water decomposition in the hydrogen evolution reaction.

The beneficial effects of the present invention are as follows.

1) With respect to the present invention, an Ni—Mo bonded precursor is formed by innovatively using the confinement effect to precisely restrict Ni ions to be located in a lattice matrix of Mo-based ions, and a dinuclear metal sulfide $Ni_2Mo_6S_6O_2$ is formed by precisely adjusting and controlling a concentration of a sulfur atmosphere and utilizing a reconstruction effect of Ni element in the lattice matrix of the Mo-based compound. Furthermore, a growth direction of $Ni_2Mo_6S_6O_2$ is precisely adjusted and controlled by using a method for growing a single crystal in a limited area, so that $Ni_2Mo_6S_6O_2$ is grown, taking a single crystal $MoS_2$ as a growth template, with the single crystal $MoS_2$ alternately along a crystal plane (110) of the single crystal $MoS_2$, so as to form a twin $Ni_2Mo_6S_6O_2/MoS_2$ two-dimensional nanosheet with exposed (00L) crystal planes in which $Ni_2Mo_6S_6O_2$ and $MoS_2$ are intergrown.

2) The intergrown twin $Ni_2Mo_6S_6O_2/MoS_2$ two-dimensional nanosheet with exposed (00L) crystal planes prepared by the present invention may be directly applied, as a high efficiency catalyst, in the electrocatalytic water decomposition in the hydrogen evolution reaction.

DETAILED DESCRIPTION OF THE EMBODIMENTS

The following is a further description of the present invention, but not a limitation of the present invention.

Embodiment 1

Figures 1A, 1B, 1C:
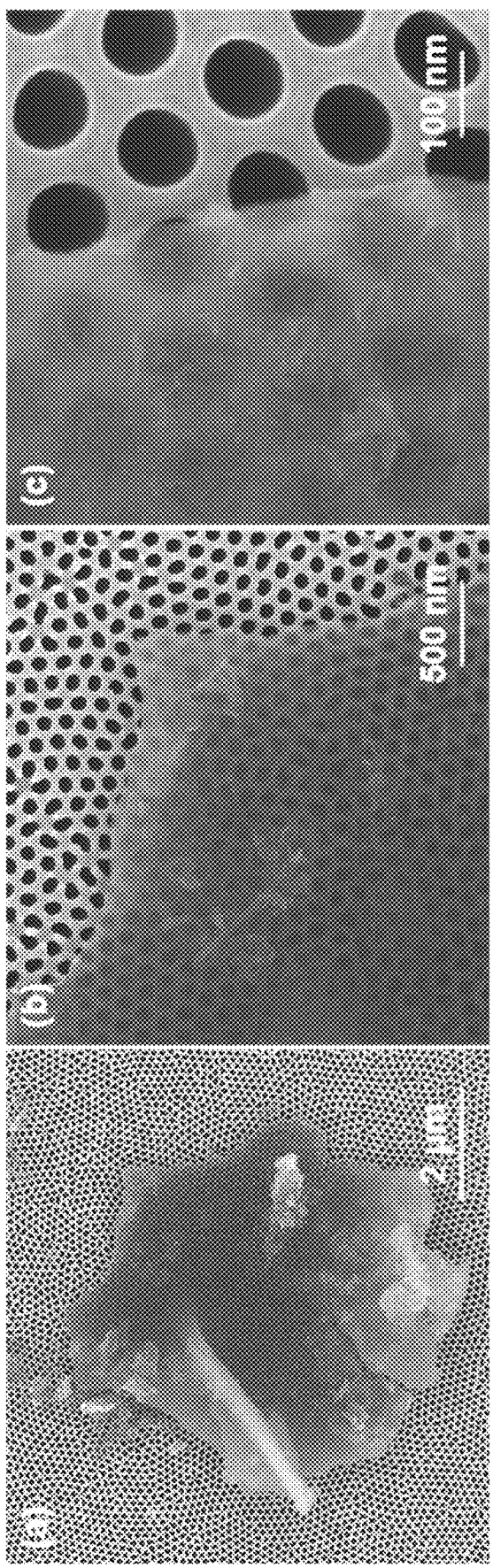
FIGS. 1A-1C are scanning electron microscope micrographs of $Ni_2Mo_6S_6O_2/MoS_2$ at three different scales.
Figure 2:
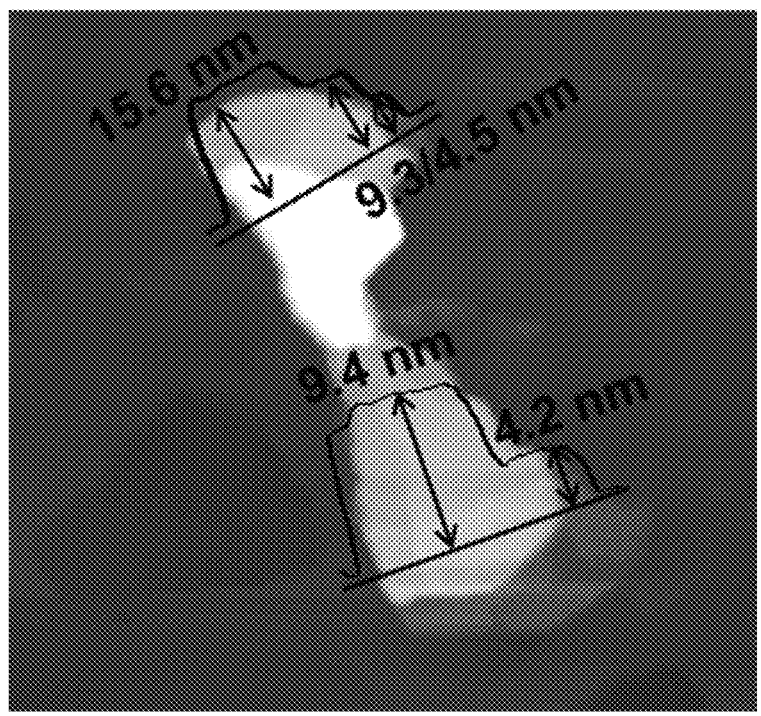
FIG. 2 is an atomic force microscope micrograph of $Ni_2Mo_6S_6O_2/MoS_2$.
Figure 3:
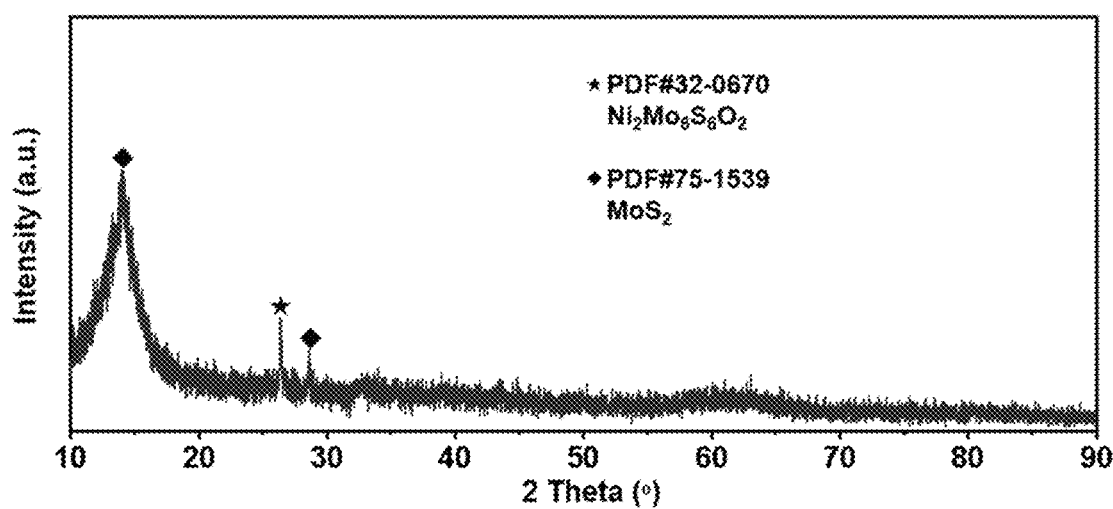
FIG. 3 is an X-ray diffraction fast-scan (with a scanning speed of 10°/min) spectrum of $Ni_2Mo_6S_6O_2/MoS_2$.
Figure 4:
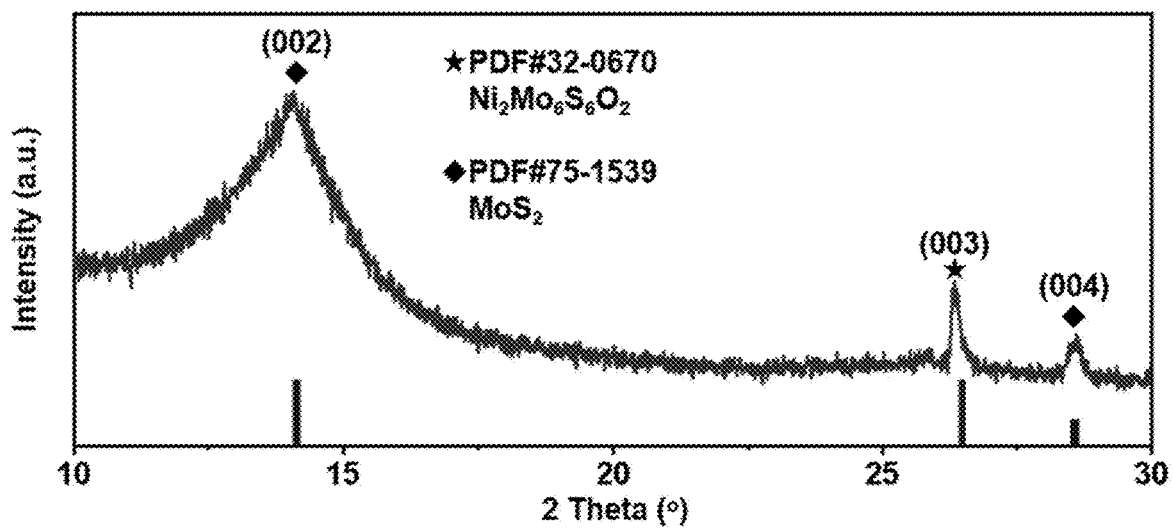
FIG. 4 is an X-ray diffraction fast-scan (with a scanning speed of 0.1°/min) spectrum of $Ni_2Mo_6S_6O/MoS_2$.
Figure 5:
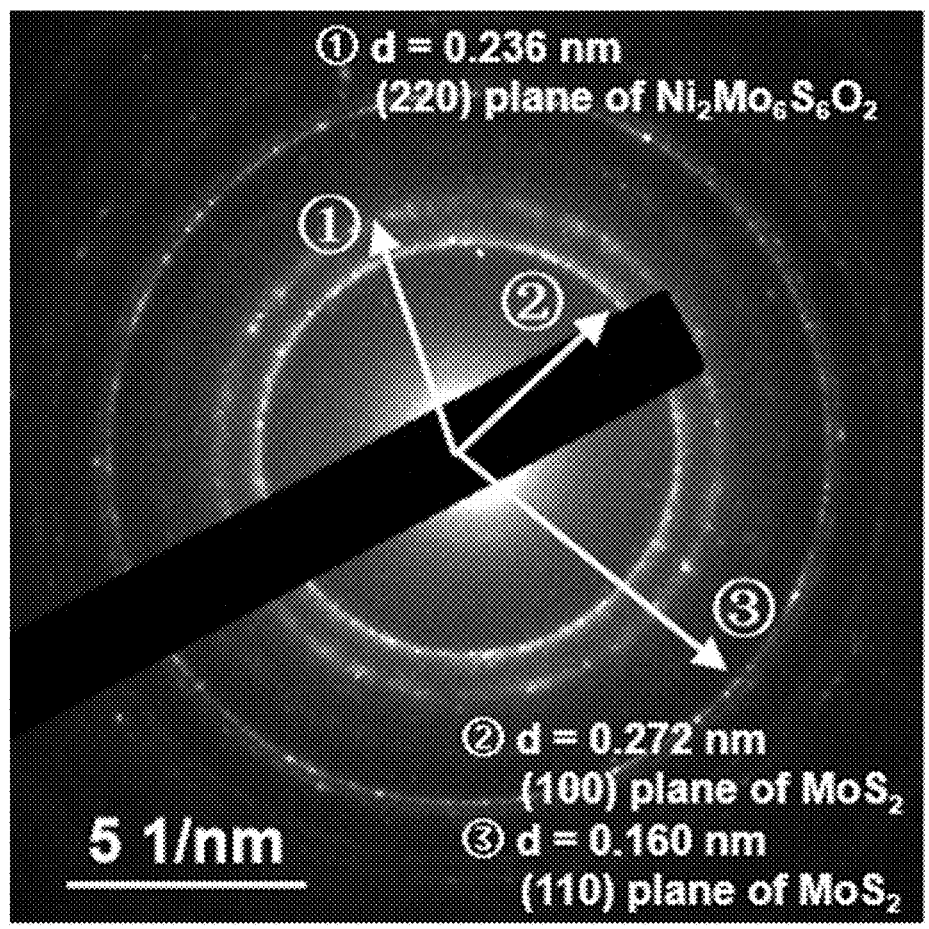
FIG. 5 is an electron diffraction spectrum of a selected area of $Ni_2Mo_6S_6O_2/MoS_2$.

A method for synthesizing an intergrown twin $Ni_2Mo_6S_6O_2/MoS_2$ two-dimensional nanosheet with exposed (00L) crystal planes, the method includes the steps of:

1) obtaining a solution A, by dissolving a molybdenum source and a nickel source with a molar ratio of Mo:Ni of 1:1.5 in a $H_2O_2$ aqueous solution with a mass ratio of 5% wt. and heating at a constant temperature of 60° C. until the molybdenum source and the nickel source are completely dissolved;

2) obtaining a saturated solution B containing a large amount of undissolved soluble salt solids, by adding 20 g of a soluble salt into 15 mL, of pure water and heating to 60° C. and continuously stirring and stopping the heating and stirring after crystallization occurs above the mixture and cooling the mixture in ice water;

3) obtaining a mixture C, by mixing and stirring 0.1 mL of the solution A, 1 mL of the solution B, and all undissolved soluble salt solids of step 2);

4) obtaining a dry solid, by placing the mixture C in liquid nitrogen for freezing and then placing the mixture C in a vacuum freeze dryer for vacuum freeze-drying for 24 hours, wherein the obtained dry solid is placed in a porcelain boat A, and then the porcelain boat A is placed in the center of a tube furnace, and a porcelain boat B containing 20 g of a sulfur source is placed at an uptake of the porcelain boat A, the distance between the porcelain boat A and the porcelain boat B is precisely adjusted to be 3.5 cm, so that the concentration of the sulfur source above the porcelain boat A is moderate to prevent the excessive concentration of the sulfur source from destroying the Ni—Mo structure to form separate $NiS_2$ and $MoS_2$;

5) introducing inert gas into the tube furnace, wherein a flow rate of the inert gas is 15 mL/thin, and the temperature is raised to 400° C. with a rate of 5° C./min and is kept for 5 hours; and 6) taking out the porcelain boat A after the vulcanization is completed, and washing the sample in the porcelain boat A with pure water and ethanol and then drying at room temperature, wherein the resulting product is an intergrown twin $Ni_2Mo_6S_6O_2/MoS_2$ two-dimensional nanosheet, the prepared $Ni_2Mo_6S_6O_2/MoS_2$ is in form of a two-dimensional nanosheet (as shown in FIGS. 1A-1C), has an average thickness of about 4.3 nm (as shown in FIG. 2), and has an intergrown twin phase structure of $Ni_2Mo_6S_6O_2$ and $MoS_2$ with exposed (00L) crystal planes (such as FIG. 3, FIG. 4 and FIG. 5).

Embodiment 2

Referring to Embodiment 1, Embodiment 2 is different from Embodiment 1 in that, the mass ratio of the molybdenum source to the nickel source is 1:1.5-1:2, the mass percentage of the H$_2$O$_2$ aqueous solution is 5-10%, and the heating temperature is 60-90° C.

Embodiment 3

Referring to Embodiment 1, Embodiment 3 is different from Embodiment 1 in that, the mass of the soluble salt is 20-50 g, the volume of the pure water is 15-30 mL, and the heating temperature is 60-100° C.

Embodiment 4

Referring to Embodiment 1, Embodiment 4 is different from Embodiment 1 in that, the volume of the pipetting solution A is 0.1-0.2 mL, and the volume of the pipetting solution B is 1-2 mL.

Embodiment 5

Referring to Embodiment 1, Embodiment 5 is different from Embodiment 1 in that, the vacuum freeze-drying time is 24-48 hours, the mass of the sulfur source is 20-40 g, and the distance between the porcelain boat A, and the porcelain boat B is precisely adjusted to be 3.5-4 cm.

Embodiment 6

Referring to Embodiment 1, Embodiment 6 is different from Embodiment 1 in that, the flow rate of the inert gas is 15-25 mL/min, the temperature raising rate is 5-10° C./min, the target temperature is 400-500° C., and the constant temperature time is 5-10 hours.

Application Example 1

The Ni$_2$Mo$_6$S$_6$O$_2$/MoS$_2$ two-dimensional nanosheet obtained in Embodiment 1 was carried on a carbon cloth as a catalytic electrode. The Ni$_2$Mo$_6$S$_6$O$_2$/MoS$_2$ two-dimensional nanosheet catalytic electrode and the NiS$_2$ and MoS$_2$ catalytic materials synthesized under the same conditions were linearly scanned respectively, and the specific steps are as follows.

Figure 6:
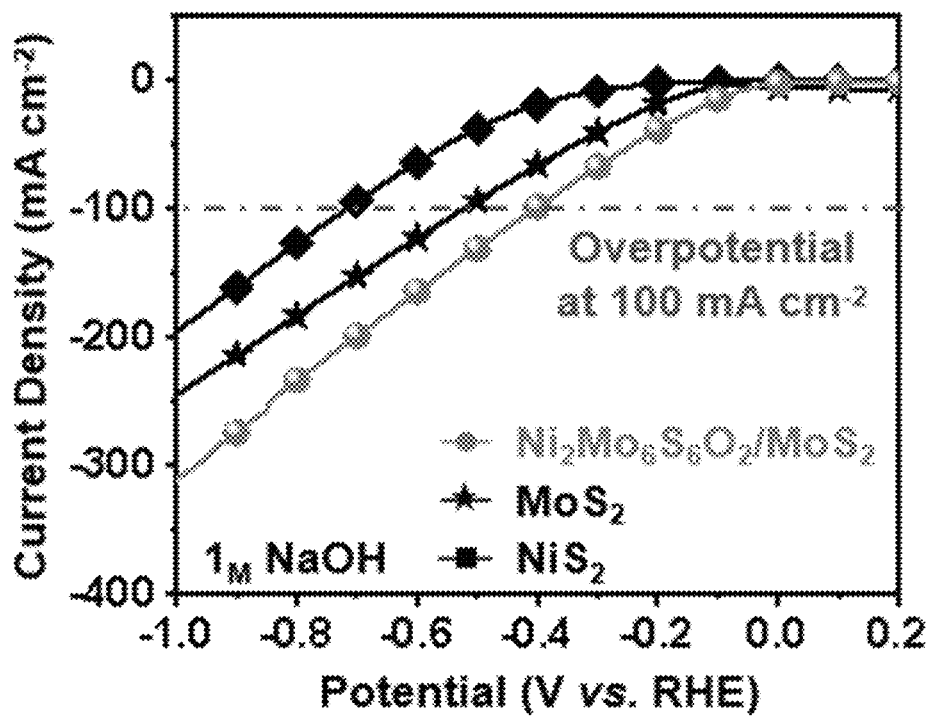
FIG. 6 is a graph of linear scanning for $Ni_2Mo_6S_6O_2/MoS_2$, $NiS_2$ and $MoS_2$.

A three-electrode configuration was used, with the catalytic electrode (Ni$_2$Mo$_6$S$_6$O$_2$, MoS$_2$) as a working electrode, Ag/AgCl as a reference electrode, and platinum as a counter electrode. The electrolyte is an aqueous solution of 1 mol/L sodium hydroxide. The linear scanning was performed under the condition of 10 mV/s. The comparison of the results of the linear sweep voltammetry (LSV) shows that the HER performance of Ni$_2$Mo$_6$S$_6$O$_2$/MoS$_2$ is stronger than that of NiS$_2$ and MoS$_2$ (FIG. 6), which indicates that Ni$_2$Mo$_6$S$_6$O$_2$/MoS$_2$ has an active site different from that of NiS$_2$ and MoS$_2$ (the active site of MoS$_2$ is Mo—S, the active site of NiS$_2$ is Ni—S), and further indicates that the main active site of Ni$_2$Mo$_6$S$_6$O$_2$/MoS$_2$ is in Ni$_2$Mo$_6$S$_6$O$_2$ instead of MoS$_2$, The HER performance of Ni$_2$Mo$_6$S$_6$O$_2$/MoS$_2$ better than that of MoS$_2$ proved that the introduction of Ni into MoS$_2$ can effectively improve the performance of MoS$_2$.

Application Example 2

The Ni$_2$Mo$_6$S$_6$O$_2$/MoS$_2$ two-dimensional nanosheet obtained in Embodiment 1 was carried on a carbon cloth as a catalytic electrode. The Ni$_2$Mo$_6$S$_6$O$_2$/MoS$_2$ two-dimensional nanosheet catalytic electrode and a commercial platinum carbon (20%) electrode were subjected to a linear scanning test, and the specific steps are as follows.

Figure 7:
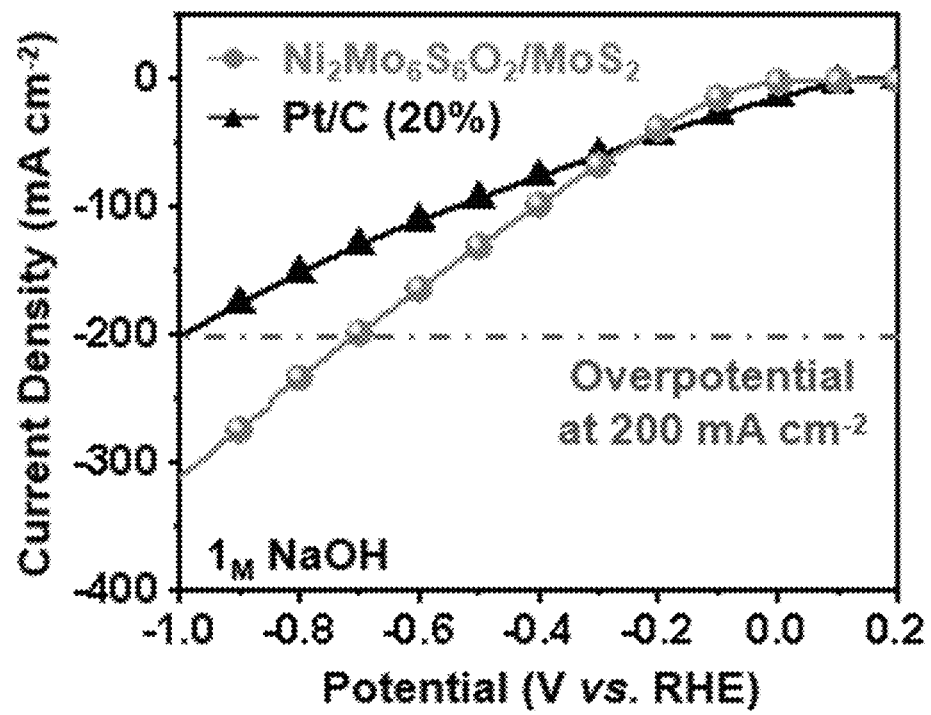
FIG. 7 is a graph of linear scanning for $Ni_2Mo_6S_6O_2/MoS_2$ and PVC (20%)

A three-electrode configuration was used, with the Ni$_2$Mo$_6$S$_6$O$_2$/MoS$_2$ two-dimensional nanosheet catalytic electrode and the commercial platinum carbon (20%) catalyst as a working electrode, Ag/AgCl as a reference electrode, and platinum as a counter electrode. The electrolyte is an aqueous solution of 1 mol/L sodium hydroxide. The linear scanning was performed under the condition of 10 mV/s. The comparison of the results of the linear sweep voltammetry (LSV) shows that the initial potential of Ni$_2$Mo$_6$S$_6$O$_2$/MoS$_2$ is close to that of Pt/C (20%) (FIG. 7), and as the overpotential increases, the increase of the reaction current of Ni$_2$Mo$_6$S$_6$O$_2$/MoS$_2$ is much larger than that of Pt/C (20%), and finally Ni$_2$Mo$_6$S$_6$O$_2$/MoS$_2$ exhibits a HER activity superior to that of Pt/C (20%) at a large overpotential.

Application Example 3

The Ni$_2$Mo$_6$S$_6$O$_2$/MoS$_2$ two-dimensional nanosheet obtained in Embodiment 1 was carried on a carbon cloth as a catalytic electrode. The Ni$_2$Mo$_6$S$_6$O$_2$/MoS$_2$ two-dimensional nanosheet catalytic electrode and a commercial platinum carbon (20%) electrode were subjected to a step constant current test, and the specific steps are as follows.

Figure 8:
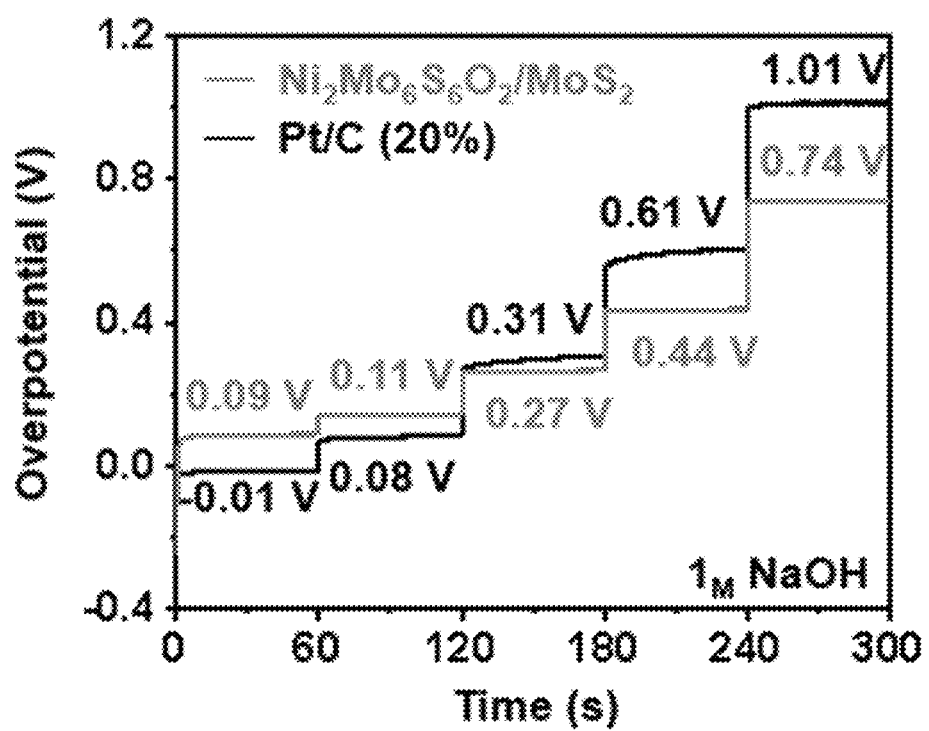
FIG. 8 is a graph of multi-step constant current of $Ni_2Mo_6S_6O_2/MoS_2$ and Pt/C (20%.

A three-electrode configuration was used, with the Ni$_2$Mo$_6$S$_6$O$_2$/MoS$_2$ two-dimensional nanosheet catalytic electrode and the commercial platinum carbon (20%) catalyst as a working electrode, Ag/AgCl as a reference electrode, and platinum as a counter electrode. The electrolyte is an aqueous sodium of 1 mol/L hydroxide solution. The step constant current test is performed under the conditions of 10 mA/cm$^2$, 20 mA/cm$^2$, 50 mA/cm$^2$, 100 mA/cm$^2$ and 200 mA/cm$^2$, respectively, and each test period lasts for 60 seconds. The step constant current curve (FIG. 8) shows that Ni$_2$Mo$_6$S$_6$O$_2$/MoS$_2$ has a superior HER activity: at a current density of 250 mA/cm$^{-2}$, Ni$_2$Mo$_6$S$_6$O$_2$/MoS$_2$ has an overpotential of 0.09 V, which is close to the overpotential of Pt/C: (20%) which is −0.01 V; as the current density increases, the overpotential of Ni$_2$Mo$_6$S$_6$O$_2$/MoS$_2$ and the overpotential of Pt/C (20%) gradually decrease, and finally at the current density of greater than 50 mA/cm$^{-2}$, it shows that Ni$_2$Mo$_6$S$_6$O$_2$/MoS$_2$ has an advantage of having an overpotential smaller than that of Pt/C (20%). Therefore, in the current industry for producing hydrogen by electrolyzing water, it is required to evaluate the HER activity of the catalyst when the current density is greater than 100 mA/cm$^{-2}$, Ni$_2$Mo$_6$S$_6$O$_2$/MoS$_2$ exhibits the activity and the cheapness superior to that of Pt/C (20%).

The above description are the preferred embodiments of the present invention. It should be noted that, several improvements and changes can be made by those of ordinary skill in the art without departing from the inventive concept of the present invention, all of which belong to the scope of protection of the present invention.

What is claimed is:
1. A method for synthesizing an intergrown twin Ni$_2$Mo$_6$S$_6$O$_2$/MoS$_2$ two-dimensional nanosheet with exposed (00L) crystal planes, comprising:
   using an ion insertion method to restrict Ni ions to be located in a lattice matrix of a Mo-based compound to form an Ni—Mo bonded precursor;
   adjusting and controlling a concentration of a sulfur atmosphere to form a dinuclear metal sulfide Ni$_2$Mo$_6$S$_6$O$_2$ and using a method for growing a single crystal in a limited area to adjust and control a growth direction of $Ni_2Mo_6S_6O_2$, wherein the $Ni_2Mo_6S_6O_2$ is grown, and a single crystal $MoS_2$ is used as a growth template, with the single crystal $MoS_2$ alternately along a crystal plane (110) of the single crystal $MoS_2$, to form a twin $Ni_2Mo_6S_6O_2/MoS_2$ two-dimensional nanosheet, wherein the $Ni_2Mo_6S_6O_2$ and the $MoS_2$ are intergrown in the twin $Ni_2Mo_6S_6O_2/MoS_2$ two-dimensional nanosheet.

2. The method according to claim 1, comprising the steps of:
  1. Obtaining a first solution, by dissolving a molybdenum source and a nickel source in a $H_2O_2$ aqueous solution, and heating at a constant temperature until the molybdenum source and the nickel source are completely dissolved; wherein a Mo:Ni molar ratio of the molybdenum source and the nickel source is 1:1-1:2, a mass percentage of the $H_2O_2$ aqueous solution is 1-10 wt. %, and temperature of the heating is 60-90° C.;
  2. Obtaining a second saturated solution containing a large amount of undissolved soluble salt solids, by adding a soluble salt into pure water under heating to obtain a first mixture, and stirring, and stopping the heating and stirring after a crystallization occurs above the first mixture and cooling the first mixture in ice water; wherein the soluble salt comprises sodium chloride, potassium chloride, sodium sulfate and potassium sulfate;
  3. Obtaining a second mixture, by mixing and stirring the first solution, the second solution, and all the undissolved soluble salt solids of step 2);
  4. Obtaining a dry solid, by placing the second mixture in liquid nitrogen for freezing and then placing the second mixture in a vacuum freeze dryer for vacuum freeze-drying for 12-48 hours, wherein the dry solid obtained is placed in a first porcelain boat, and then the first porcelain boat is placed in a center of a tube furnace, and a second porcelain boat containing a sulfur source is placed at an uptake port of the first porcelain boat, and a distance between the first porcelain boat and the second porcelain boat is precisely adjusted to be 3-4 cm;
  5. Introducing inert gas into the tube furnace, adjusting and controlling a flow rate of the inert gas to be 10-25 mL/min, and raising a temperature to a target temperature for constant temperature calcination; wherein a temperature raising rate is 1-10° C./min, the target temperature is 300-500° C., and a constant temperature calcination time is 1-10 hours; and
  6. Taking out the first porcelain boat after a vulcanization is completed, and washing a sample in the first porcelain boat with pure water and ethanol and then drying at room temperature, wherein a resulting product is the intergrown twin $Ni_2Mo_6S_6O_2/MoS_2$ two-dimensional nanosheet.

3. The method according to claim 2, wherein the molybdenum source comprises molybdenum powder, molybdenum trioxide, molybdenum dioxide, ammonium molybdate and molybdenum acetylacetonate; and the nickel source comprises nickel nitrate, nickel acetylacetonate and nickel chloride.

4. The method according to claim 2, wherein in step 2), a mass of the soluble salt is 10-50 g, a volume of the pure water is 5-30 mL, and a temperature of the heating is 50-100° C.

5. The method according to claim 2, wherein in step 3), a volume of the first solution is 0.05-0.2 mL, and a volume of the second solution is 0.5-2 mL.

6. The method according to claim 2, wherein in step 4), the sulfur source comprises thiourea and elemental sulfur, and a mass of the sulfur source is 10-40 g.

7. The method for according to claim 2, wherein in step 5), the inert gas comprises nitrogen and argon.

8. A method of electrocatalytic water decomposition in a hydrogen evolution reaction, comprising the step of using the intergrown twin $Ni_2Mo_6S_6O_2/MoS_2$ two-dimensional nanosheet with the exposed (00L) crystal planes obtained by the method according to claim 1 as a catalyst in the electrocatalytic water decomposition in the hydrogen evolution reaction.

9. The method according to claim 8, wherein the method for synthesizing the intergrown twin $Ni_2Mo_6S_6O_2/MoS_2$ two-dimensional nanosheet with exposed (00L) crystal planes comprises the steps of:
  1. Obtaining a first solution, by dissolving a molybdenum source and a nickel source in a $H_2O_2$ aqueous solution, and heating at a constant temperature until the molybdenum source and the nickel source are completely dissolved; wherein a Mo:Ni molar ratio of the molybdenum source and the nickel source is 1:1-1:2, a mass percentage of the $H_2O_2$ aqueous solution is 1-10 wt. %, and a temperature of the heating is 60-90° C.;
  2. Obtaining a second saturated solution containing a large amount of undissolved soluble salt solids, by adding a soluble salt into pure water under heating to obtain a first mixture, and stirring, and stopping the heating and stirring after a crystallization occurs above the first mixture and cooling the first mixture in ice water; wherein the soluble salt comprises sodium chloride, potassium chloride, sodium sulfate and potassium sulfate;
  3. Obtaining a second mixture, by mixing and stirring the first solution, the second solution, and all the undissolved soluble salt solids of step 2);
  4. Obtaining a dry solid, by placing the second mixture in liquid nitrogen for freezing and then placing the second mixture in a vacuum freeze dryer for vacuum freeze-drying for 12-48 hours, wherein the dry solid obtained is placed in a first porcelain boat, and then the first porcelain boat is placed in a center of a tube furnace, and a second porcelain boat containing a sulfur source is placed at an uptake port of the first porcelain boat, and a distance between the first porcelain boat and the second porcelain boat is precisely adjusted to be 3-4 cm;
  5. Introducing inert gas into the tube furnace, adjusting and controlling a flow rate of the inert gas to be 10-25 mL/min, and raising a temperature to a target temperature for constant temperature calcination; wherein a temperature raising rate is 1-10° C./min, the target temperature is 300-500° C., and a constant temperature calcination time is 1-10 hours; and
  6. Taking out the first porcelain boat after a vulcanization is completed, and washing a sample in the first porcelain boat with pure water and ethanol and then drying at room temperature, wherein a resulting product is the intergrown twin $Ni_2Mo_6S_6O_2/MoS_2$ two-dimensional nanosheet.

10. The method according to claim 9, wherein the molybdenum source comprises molybdenum powder, molybdenum trioxide, molybdenum dioxide, ammonium molybdate and molybdenum acetylacetonate; and the nickel source comprises nickel nitrate, nickel acetylacetonate and nickel chloride.

11. The method according to claim 9, wherein in step 2), a mass of the soluble salt is 10-50 g, a volume of the pure water is 5-30 mL, and a temperature of the heating is 50-100° C.

12. The method according to claim 9, wherein in step 3), a volume of the first solution is 0.05-0.2 mL, and a volume of the second solution is 0.5-2 mL.

13. The method according to claim 9, wherein in step 4), the sulfur source comprises thiourea and elemental sulfur, and a mass of the sulfur source is 10-40 g.

14. The method according to claim 9, wherein in step 5), the inert gas comprises nitrogen and argon.

* * * * *